United States Patent [19]
Gazsi et al.

[11] Patent Number: 5,138,568
[45] Date of Patent: Aug. 11, 1992

[54] METHOD AND CIRCUIT CONFIGURATION FOR AVOIDING OVERFLOWS IN AN ADAPTIVE, RECURSIVE DIGITAL WAVE FILTER HAVING FIXED POINT ARITHMETIC

[75] Inventors: Lajos Gazsi; Dieter Brückmann, both of Dusseldorf, Fed. Rep. of Germany

[73] Assignee: Siemens Aktiengesellschaft, Munich, Fed. Rep. of Germany

[21] Appl. No.: 532,435

[22] Filed: Jun. 4, 1990

[30] Foreign Application Priority Data

Jun. 5, 1989 [EP] European Pat. Off. ......... 89110162.8

[51] Int. Cl.$^5$ .............................................. G06F 15/31
[52] U.S. Cl. ............................ 364/724.03; 364/724.14
[58] Field of Search ....................... 364/724.03, 724.14, 364/724.19, 724.01

[56] References Cited

U.S. PATENT DOCUMENTS

| | | | |
|---|---|---|---|
| 3,919,671 | 11/1975 | Fettweis et al. | 364/724.14 X |
| 3,967,099 | 6/1976 | Fettweis | 364/724.14 X |
| 3,980,872 | 9/1976 | Fettweis et al. | 364/724.14 |
| 4,095,276 | 6/1978 | Verkroost et al. | 364/724.03 X |
| 4,475,229 | 10/1984 | Frese | 364/724.14 X |
| 4,716,537 | 12/1987 | Scheuermann | 364/724.14 |
| 4,825,396 | 4/1989 | Gazsi | 364/724.15 |
| 4,827,443 | 5/1989 | Meerhotter et al. | 364/724.14 |

Primary Examiner—Tan V. Mai
Attorney, Agent, or Firm—Herbert L. Lerner; Laurence A. Greenberg

[57] ABSTRACT

An adaptive, recursive digital wave filter includes a transfer filter and a gradient filter each having a respective adaptor with a given coefficient. A method and circuit configuration for avoiding overflows in the filter include multiplying a signal emitted by the transfer filter to the gradient filter by a scaling factor being equal to the difference between 1 and the amount of the given coefficient.

5 Claims, 2 Drawing Sheets

METHOD AND CIRCUIT CONFIGURATION FOR AVOIDING OVERFLOWS IN AN ADAPTIVE, RECURSIVE DIGITAL WAVE FILTER HAVING FIXED POINT ARITHMETIC

BACKGROUND OF THE INVENTION

1. Field of the Invention

The invention relates to a method and circuit configuration for avoiding overflows in an adaptive, recursive digital wave filter including a transfer filter and a gradient filter, wherein the transfer filter and the gradient filter each have an adaptor with a given coefficient.

Adaptive filters are of major significance in many areas of discrete-time signal processing, particular in the fields of systems analysis, echo compensation in two-wire/four-wire transitions, line distortion correction and speech processing. In comparison with constant filters, it is a characteristic of such adaptive filters that the filter parameters which determine the transfer properties are optimally adjusted with respect to a Q function. Such a Q function is obtained, for instance, by minimizing the mean quadratic error of the output signal at the adaptive filter with respect to a reference signal. In typical methods, the partial derivations (gradient of the Q function are formed in accordance with the filter parameters to be adapted. For most quality criteria, that method is traceable to the formation of the partial derivations of the output signal of the adaptive filter in accordance with the filter parameters.

2. Description of the Related Art

Co-pending U.S. application Ser. No. 525,163, filed May 17, 1990, discloses a method and a configuration for performing the method, with which the gradient of the output signal of a discrete-time network, such as a filter, can be obtained with respect to the network or filter parameters. The gradient signal sought appears at the output of a gradient network that is supplied with internal signals of the network. The method or configuration becomes particularly simple for linear networks, because the gradient network has essentially the same structure as the given network. As a result, an expensive network synthesis becomes unnecessary. Further simplification is obtained for digital filters that are constructed solely with two-gate adaptors as well as for digital filters in which the network parameters are multiplication coefficients.

Digital wave filters known from German Patent DE-PS 20 27 303, corresponding to U.S. Pat. No. 3,967,099, for instance, are formed solely of time-lag elements and adaptors, which in turn are composed of adders or subtractors and multipliers. Various transfer functions can be adjusted with the aid of the multiplication coefficients. If the digital wave filters are used as adaptive filters, the coefficients are variable. The coefficients can be adjusted automatically to the desired optimal value by various methods, for instance the gradient method. In order to do this, the derivations of the filter output signal in accordance with the various coefficients are required. Such values can be determined with gradient filters in accordance with co-pending U.S. application Ser. No. 525,163, filed May 17, 1990. The gradient filters are likewise constructed as digital wave filters. Thus the gradient filters are formed of adaptors and time-lag elements. The input signal of the gradient filter is the product of the input signal of the multiplier for multiplication with one of the coefficients that determine the transfer behavior at a time. The output signal of the gradient filter is then the corresponding gradient of the output signal of the transfer filter with respect to the filter parameter or with respect to the coefficient.

When constructing the digital wave filters, the processing width of adders, subtractors and multipliers set limits on the representation range of the digital signals. In digital wave filters having fixed point arithmetic, the representable signal range is limited to the range of $-1 \leq x \leq 1 - 2^{-n}$, where n is the processing width and x is the representable signal. An overflow occurs in the event that the results of the additions exceed the available range, making the outcome incorrect.

For an adaptor of a digital wave filter, the following equation applies:

$$b_2 = (1-\mu) \cdot a_1 + \mu \cdot a_2 \qquad (1)$$

where $a_1$ and $a_2$ are the input signals and $\mu$ is given multiplier coefficient, which can assume values between 0 and 1. Since the amounts of the input signals are $|a_1|$ 1 and $|a_2|$ 1, the following inequalities apply for the amount of the output signal $|b_2|$:

$$|b_2| \leq (1-\mu) \cdot |a_1| + \mu \cdot |a_2| \qquad (2a)$$

$$|b_2| \leq (1-\mu) + \mu \qquad (2b)$$

$$|b_2| \leq 1. \qquad (2c)$$

This assures that under no circumstances can the adaptor cause overflows for the output signal $b_2$. However, this is not true for the corresponding adaptor of the gradient filter, because:

$$b_2' = a_1' + \mu \cdot a_2' \qquad (3a)$$

$$|b_2'| \leq |a_1'| + \mu \cdot |a_2'| \qquad (3b)$$

$$|b_2'| \leq 1 + \mu. \qquad (3c)$$

As is apparent from equations 3a-3c, the output signal $b_2'$ of the subadaptor of the gradient filter is certainly capable of overflowing. Even if the input signal $a_1'$ is scaled with a factor d between zero and one, nevertheless an overflow occurs for the output signal $b_2'$, if $\mu$ is in the range of $1 - d < \mu \leq 1$.

It is accordingly an object of the invention to provide a method and circuit configuration for avoiding overflows in an adaptive, recursive digital wave filter having fixed point arithmetic, which overcome the hereinafore-mentioned disadvantages of the heretofore-known methods and devices of this general type and which avoid overflows in the gradient filter of the adaptive, recursive digital wave filter.

SUMMARY OF THE INVENTION

With the foregoing and other objects in view there is provided, in accordance with the invention, a method for avoiding overflows in an adaptive, recursive digital wave filter including a transfer filter and a gradient filter each having a respective adaptor with a given coefficient, which comprises multiplying a signal emitted by the transfer filter to the gradient filter by a scaling factor being equal to the difference between 1 and the amount of the given coefficient.

With the objects of the invention in view, there is also provided an adaptive, recursive digital wave filter having a circuit configuration for avoiding overflows in the filter, comprising a transfer filter including an adaptor having a first adder with an output, supply leads connected to the first adder, an algebraic sign inverter connected in one of the supply leads, second and third adders each being connected to a respective one of the supply leads and each having an output lead forming a respective output terminal, a first multiplier for multiplication by a given coefficient having a positive algebraic sign, the first multiplier having an input lead, the output of the first adder being connected through the first multiplier to the second and third adders as an additional supply means; a gradient filter including an adaptor having a fourth adder with an output lead, supply leads connected to the fourth adder, a second multiplier having an input lead and being connected in one of the supply leads for multiplication by the given coefficient, a fifth adder having an output lead and being connected to the input lead of the second multiplier and the output lead of the fourth adder, and the output leads of the fourth and fifth adders forming respective output terminals; and a third multiplier having an input lead connected to the input lead of the first multiplier and an output lead connected to one of the supply leads connected directly to the fourth adder for multiplying a signal emitted by the transfer filter to the gradient filter by a scaling factor being equal to the difference between 1 and the amount of the given coefficient.

With the objects of the invention in view, there is furthermore provided an adaptive, recursive digital wave filter having a circuit configuration for avoiding overflows in the filter, comprising a transfer filter including an adaptor having a first adder with an output, supply leads connected to the first adder, second and third adders each being connected to a respective one of the supply leads and each having an output lead forming a respective output terminal, a first multiplier for multiplication by a given coefficient having a negative algebraic sign, the first multiplier having an input lead, the output of the first adder being connected through the first multiplier to the second and third adders as additional supply means, an algebraic sign inverter connected in one of the supply leads, a gradient filter including an adaptor having a fourth adder with an output lead, supply leads connected to the fourth adder, a second multiplier for multiplication by the given coefficient being connected in one of the supply leads, the second multiplier having an input lead, another algebraic sign inverter, a fifth adder connected to the input lead of the second multiplier and through the other algebraic sign inverter to the output lead of the fourth adder, and the output leads of the fourth and fifth adders forming respective output terminals; and a third multiplier having an input lead connected to the input lead of the first multiplier and an output lead connected to one of the supply leads connected directly to the fourth adder for multiplying a signal emitted by the transfer filter to the gradient filter by a scaling factor being equal to the difference between 1 and the amount of the given coefficient.

In accordance with a concomitant feature of the invention, the transfer filter includes a plurality of transfer subfilters connected to the adaptor of the transfer filter having the given coefficient with a positive or negative algebraic sign; and each of the transfer subfilters is connected through the third multiplier to the gradient filter for multiplication by the scaling factor in dependence on the given coefficient.

The advantage of the invention is that an overflow of the subadaptor of the gradient filter is reliably prevented at little expense.

Other features which are considered as characteristic for the invention are set forth in the appended claims.

Although the invention is illustrated and described herein as embodied in a method and circuit configuration for avoiding overflows in an adaptive, recursive digital wave filter having fixed point arithmetic, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
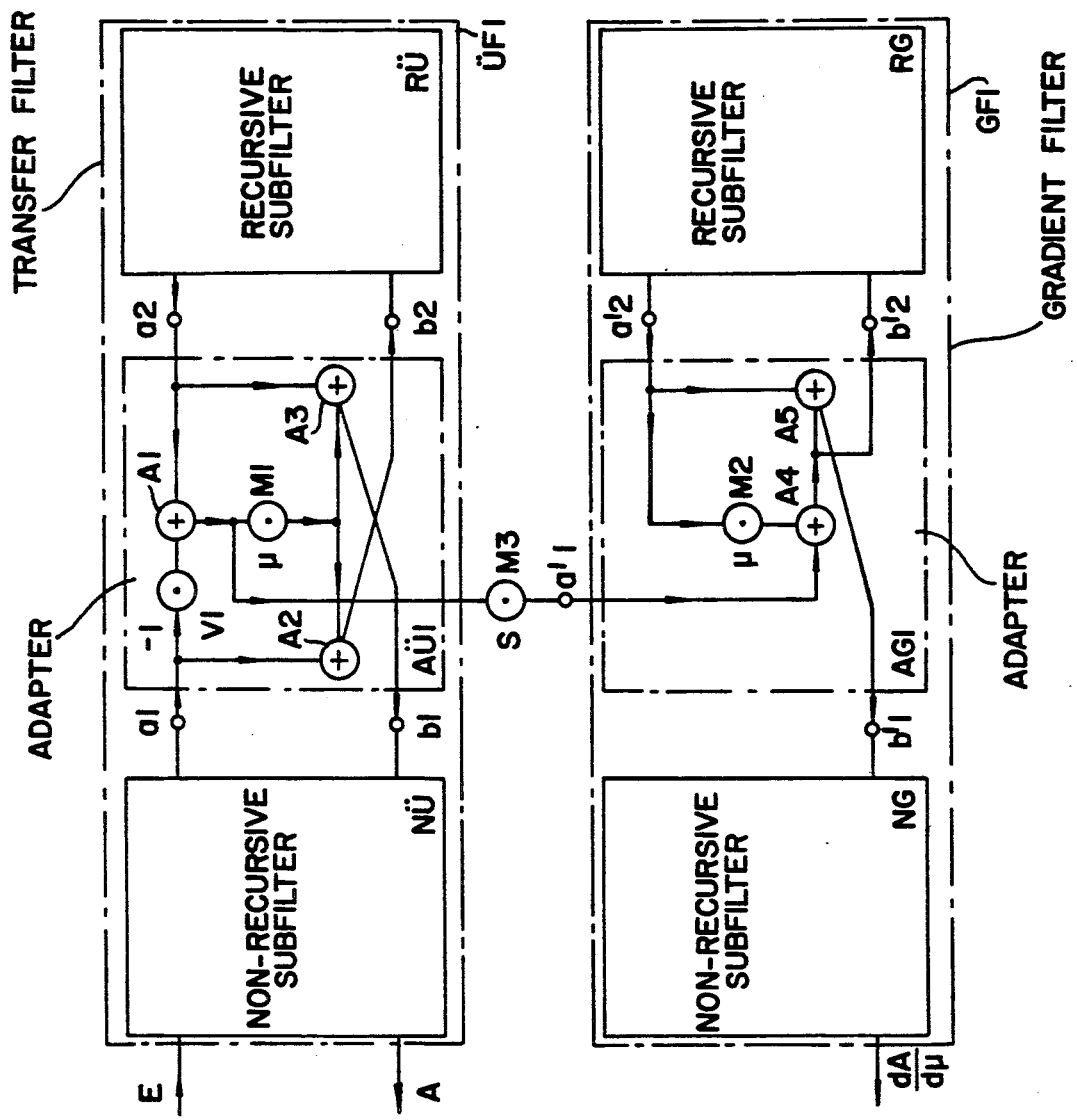
FIG. 1 is a schematic and block circuit diagram of a first exemplary embodiment of a circuit configuration for performing the method according to the invention.

Referring now in detail to the figures of the drawing in which identical elements are provided with the same reference numerals and first, particularly, to FIG. 1 thereof, there is seen a given transfer filter UF1 which is formed of a non-recursive subfilter NÜ, that is acted upon by an input signal E and carries an output signal A; a recursive subfilter RÜ; and a two-gate adaptor AÜ1. The two-gate adaptor AÜ1 receives a signal $a_1$ from the non-recursive subfilter NÜ and emits a signal $b_1$ to the non-recursive subfilter NÜ. The two-gate adaptor AÜ1 also receives a signal $a_2$ from the recursive subfilter RÜ and emits a signal $b_2$ to the recursive subfilter RÜ. An associated gradient filter GF1 correspondingly includes a non-recursive subfilter NG, which carries an output signal $dA/d\mu$ at an output; a recursive subfilter RG; and an adaptor AG1. The adaptor AG1 receives a signal $a_2'$ from the non-recursive subfilter RG and emits a signal $b_1'$ to the non-recursive subnetwork NG. The adaptor AG1 also emits a signal $b_2'$ to the recursive subnetwork RG. Moreover, a signal $a_1'$ is supplied by the adaptor AÜ1 of the transfer filter ÜF1 to the adaptor AG1 of the gradient filter GF1. The two non-recursive subfilters NÜ and NG and the recursive subfilters RÜ and RG each have the same transfer behavior.

Figure 2:
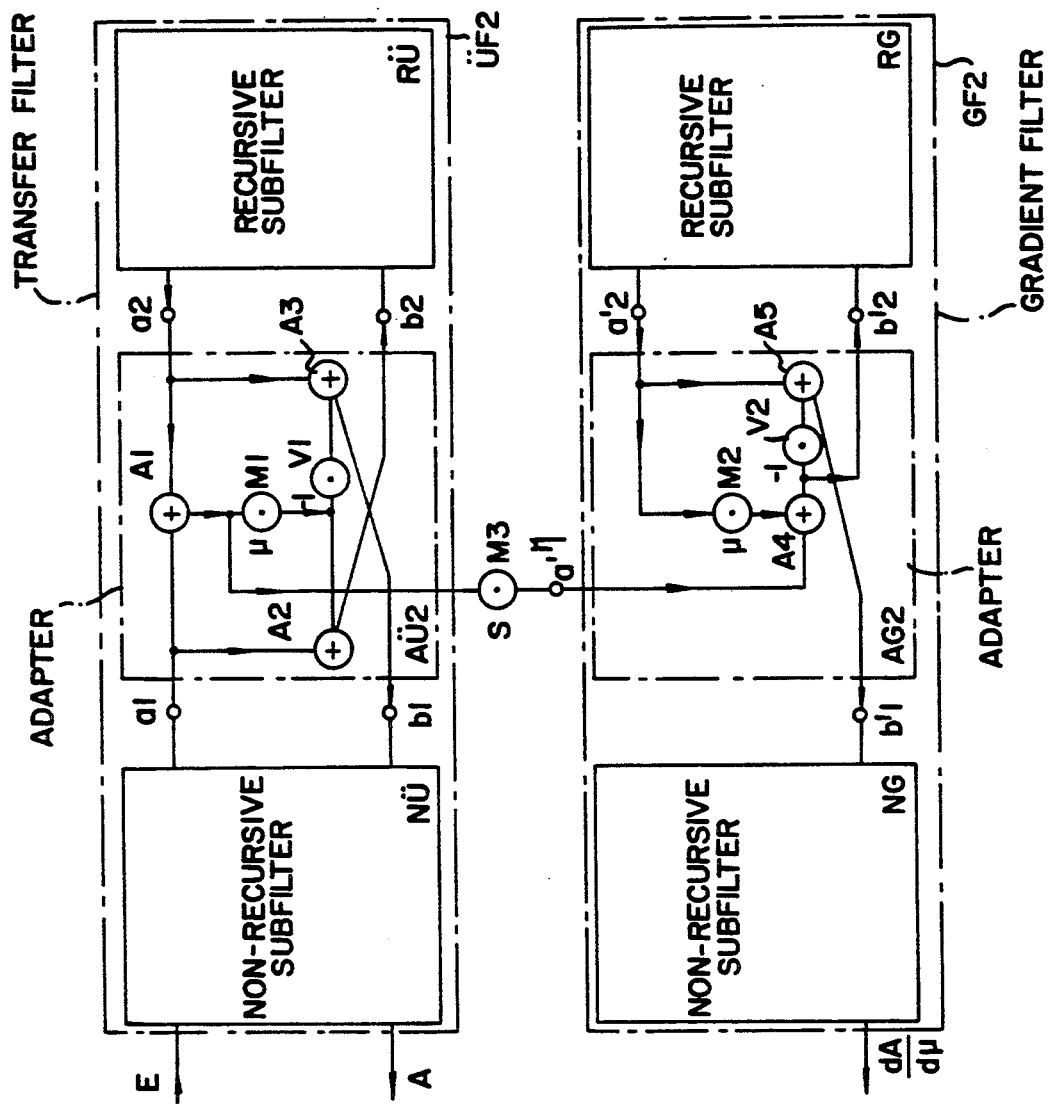
FIG. 2 is a view similar to FIG. 1 of a second exemplary embodiment of a circuit configuration for performing the method according to the invention.

The layout of the exemplary embodiment of FIG. 2 is principally identical to that of FIG. 1. The only difference between the two exemplary embodiments is the structure of the respective adaptors AÜ1 and AÜ2 being used in the transfer filters ÜF1 and ÜF2, and a resulting difference in the layout of the respective adaptors AG1 and AG2 of the gradient filters GF1 and GF2.

In FIG. 1, the supply leads in the adaptor AÜ1 of the transfer filter ÜF1 are connected to a common adder A1. An algebraic sign inverter V1 is also inserted into the supply line that carries the signal $a_1$. Furthermore, the signal $a_1$ is carried to an adder A2, and the signal $a_2$ is carried to an adder A3. The other input of each of the two adders A2 and A3 is connected to the output of the adder A1, with the interposition of a multiplier M1 for multiplication with a coefficient $\mu$. The signal b2 is supplied by the output of the adder A2, and the signal b1 is supplied by the output of the adder A3. The structure of the adaptor AG1 of the gradient filter GF1 which is derived from this is obtained as follows: The signal $a_1'$ is carried directly, and the signal $a_2'$ is carried through a multiplier M2 for multiplication by the coefficient $\mu$, to an adder A4. A further adder A5 is acted upon by the output signal of the adder A4 and the signal $a_2'$. The signals $b_1'$ and $b_2'$ are supplied by the outputs of the respective adders A5 and A4.

As compared with the adaptor AÜ1 of the exemplary embodiment of FIG. 1, the adaptor AÜ2 of the exemplary embodiment of FIG. 2 is modified solely by the fact that the algebraic sign inverter V1 is not present in the supply line leading to the adder A1 but rather is incorporated into the line between the multiplier M1 and the adder A3. As a result, however, the adaptor AG2 of FIG. 2 is also modified as compared with the adaptor AG1 of FIG. 1, specifically by incorporating an algebraic sign inverter V2 between the output of the adder A4 and one input of the adder A5.

According to both exemplary embodiments of the invention, the signal picked up at the input of the multiplier M1 and delivered to the adaptor AG1 or AG2 is multiplied by a scaling factor S. The multiplication by the scaling factor S is performed by a multiplier M3. The scaling factor S is equal to the difference between 1 and the coefficient $\mu$.

In the exemplary embodiment of FIG. 1, the adaptor A1 is well scaled for $\mu \geq$ zero. For this case, the following applies:

$$S = 1 - \mu \qquad (4a)$$

so that $$b_2' = (1-\mu)\cdot a_1' + \mu \cdot a_2'. \qquad (4b)$$

Based on the equation 4b, in accordance with the line of argument in equations 2a, 2b, 2c, it is immediately clear that the scaling factor S is always positive if the coefficient $\mu$ is between 0 and 1, as in this case.

If the coefficient $\mu$ is in the range between $-1$ and 0, as in the exemplary embodiment of FIG. 2, then the adaptor of the transfer filters must also be modified, for scaling reasons. Accordingly, the adaptor of the gradient filter changes as well. In that case, the following is true for the scaling factor S:

$$S = 1 + \mu \qquad (5)$$

for signal $b_2'$, it then follows that:

$$b_2' = (1+\mu)\cdot a_1' + \mu \cdot a_2' \qquad (6a)$$

$$|b_2'| \leq |1+\mu|\cdot|a_1'| + |\mu|\cdot|a_2'| \qquad (6b)$$

$$|b_2'| \leq |1+\mu| + |\mu| \qquad (6c)$$

$$|b_2'| \leq 1. \qquad (6d)$$

This assures that the adaptor AG2, like the adaptor AG1, cannot produce overflows under any circumstances for the output signal $b_2'$.

In closing, it should be noted that the transfer filter can also be formed of a plurality of transfer subfilters, each having an adaptor with a positive or negative coefficient. In that case each transfer subfilter having a coefficient for deriving the output signal, is then assigned a gradient filter, which is connected to the corresponding transfer subfilter through an interposed multiplier for multiplication by a scaling factor dependent on the particular coefficient.

We claim:

1. Method for avoiding overflows in an adaptive wave digital filter including a transfer filter having a first recursive subfilter, a first non-recursive subfilter and a first adaptor with a given coefficient and a gradient filter having a second recursive subfilter, a second non-recursive subfilter and a second adaptor with the given coefficient, which comprises:
   receiving signals with the first adaptor from the first recursive subfilter and from the first non-recursive subfilter;
   emitting signals with the first adaptor to the first recursive subfilter, to the first non-recursive subfilter and to the second adaptor;
   receiving signals with the second adaptor from the second recursive subfilter and from the first adaptor;
   emitting signals with the second adaptor to the second recursive subfilter and to the second non-recursive subfilter; and
   multiplying the signal emitted by the first adaptor to the second adaptor by a scaling factor being equal to the difference between 1 and the amount of the given coefficient.

2. Adaptive wave digital filter, comprising:
   a transfer filter including a first recursive subfilter, a first non-recursive subfilter and a first adaptor having a first adder with an output supplying an output signal, a first supply lead connected to said first non-recursive subfilter and to said first adder, a second supply lead connected to said first recursive subfilter and to said first supply lead, a first multiplier having an output, a first input being connected to the output signal of said first adder and a second input for multiplying a given coefficient having a positive algebraic sign with the output of said first adder, second and third adders each having an output and each being connected to the output of said first multiplier and to a respective one of said first and second supply leads, a first output lead connected between the output of said third adder and said first non-recursive subfilter, a second output lead connected between the output of said second adder and said first recursive subfilter; and
   a gradient filter including a second recursive subfilter, a second non-recursive subfilter and a second adaptor having a fourth adder with an output, a third supply lead connected to said fourth adder, a second multiplier having an output, a first input being connected to a fourth supply lead supplying an input signal and a second input for multiplying said given coefficient with the input signal of said fourth supply lead, a fifth adder having an output, a first input being connected to the output of said fourth adder and a second input being connected to said fourth supply lead, a third output lead being connected between the output of said fifth adder and said second non-recursive subfilter, a fourth output lead being connected between the output of said fourth adder and said second recursive subfilter, a third multiplier having an output being connected to said third supply lead, a first input being connected to the output of said first adder and a second input for multiplying a scaling factor with the output signal of said first adder, said scaling factor being equal to the difference between 1 and the amount of said given coefficient.

3. Wave digital filter according to claim 2, wherein said transfer filter includes a plurality of transfer subfilters connected to said adaptor of said transfer filter having said given coefficient with a positive algebraic sign; and each of said transfer subfilters is connected through said third multiplier to said gradient filter for multiplication by said scaling factor in dependence on said given coefficient.

4. Adaptive wave digital filter, comprising:

a transfer filter including a first recursive subfilter, a first non-recursive subfilter and a first adaptor having a first adder with an output supplying an output signal, a first supply lead connected to said first non-recursive subfilter and to said first adder, a second supply lead connected to said first recursive subfilter and to said first adder, a first multiplier having an output, a first input being connected to the output of said first adder and a second input for multiplying a given coefficient having a negative algebraic sign with the output signal of said first adder, second and third adders having outputs and each being connected to the output of said first multiplier and to a respective one of said first and second supply leads, said third adder being connected through a first algebraic sign inverter to said first multiplier, a first output lead connected between the output of said third adder and said first non-recursive subfilter, a second output lead connected between the output of said second adder and said first recursive subfilter; and a gradient filter including a second recursive subfilter, a second non-recursive subfilter and a second adaptor having a fourth adder with an output, a third supply lead connected to said fourth adder, a second multiplier having an output, a first input being connected to a fourth supply lead supplying an input signal and a second input for multiplying said given coefficient with the input signal of said fourth supply lead, a fifth adder having an output, a first input being connected through a second algebraic sign inverter to the output of said fourth adder and a second input being connected to said fourth supply lead, a third output lead being connected between the output of said fifth adder and said second non-recursive subfilter, a fourth output lead being connected between the output of said fourth adder and said second recursive subfilter, a third multiplier having an output being connected to said third supply lead, a first input being connected to the output of said first adder and a second input for multiplying a scaling factor by the output signal of said first adder, said scaling factor being equal to the difference between 1 and the amount of said given coefficient.

5. Wave digital filter according to claim 4, wherein said transfer filter includes a plurality of transfer subfilters connected to said adaptor of said transfer filter having said given coefficient with a negative algebraic sign; and each of said transfer subfilters is connected through said third multiplier to said gradient filter for multiplication by said scaling factor in dependence on said given coefficient.

* * * * *